US 6,750,479 B2

(12) United States Patent
Haag

(10) Patent No.: US 6,750,479 B2
(45) Date of Patent: Jun. 15, 2004

(54) SEMICONDUCTOR COMPONENT AND A METHOD FOR IDENTIFYING A SEMICONDUCTOR COMPONENT

(75) Inventor: Frieder Haag, Wannweil (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/344,030

(22) PCT Filed: Jul. 27, 2001

(86) PCT No.: PCT/DE01/02844

§ 371 (c)(1),
(2), (4) Date: Feb. 6, 2003

(87) PCT Pub. No.: WO02/13270

PCT Pub. Date: Feb. 14, 2002

(65) Prior Publication Data

US 2003/0127718 A1 Jul. 10, 2003

(30) Foreign Application Priority Data

Aug. 10, 2000 (DE) .......................................... 100 38 998

(51) Int. Cl.$^7$ ............................................. H01L 29/06
(52) U.S. Cl. ........................ 257/99; 257/98; 257/100; 257/666; 257/671; 257/676; 257/677; 250/239; 250/556; 250/566
(58) Field of Search .............................. 257/89, 90, 91, 257/95, 96, 97, 98, 99, 100, 666, 667, 668, 669, 670, 671, 676, 677; 250/556, 566, 239

(56) References Cited

U.S. PATENT DOCUMENTS 4,701,999 A * 10/1987 Palmer 5,834,648 A    11/1998 Sue et al.
5,909,122 A     6/1999 Impini et al.
5,984,190 A  * 11/1999 Nevill
6,089,095 A     7/2000 Yang

FOREIGN PATENT DOCUMENTS

EP         0 311 087 A     4/1989

OTHER PUBLICATIONS

D.D. Ricken, W, et al.: "Advanced Microsystem for Automotive Applications 99", ISBN 3–540–65183–7, pp. 126–130, 1999.
Patent Abstracts of Japan vol. 010, No. 319 (E–450), Oct. 30, 1986 & JP 61 131549 A, Jun. 19, 1986.

* cited by examiner

Primary Examiner—Wael Fahmy
Assistant Examiner—Dilinh Nguyen
(74) Attorney, Agent, or Firm—Michael J. Striker

(57) ABSTRACT

The invention concerns a semiconductor component and a method for identifying a semiconductor component that comprises at least one semiconductor substrate equipped with electronic/electromechanical components, which said semiconductor substrate—except for its leads—is embedded in a housing part made of plastic. It is proposed to equip the semiconductor substrate located in the housing part with an identifier located directly or indirectly thereon that makes it possible to distinguish the semiconductor component from other similarly-designed semiconductor components, and which can be read out from outside the housing part using ultrasound. In the case of semiconductor substrates produced in panels, the identifier makes it possible to determine the original position of the semiconductor substrate of a selected semiconductor component on a base substrate on which a plurality of semiconductor substrates were produced, even after the semiconductor substrates have been diced and placed in a housing part.

12 Claims, 2 Drawing Sheets

Fig.2
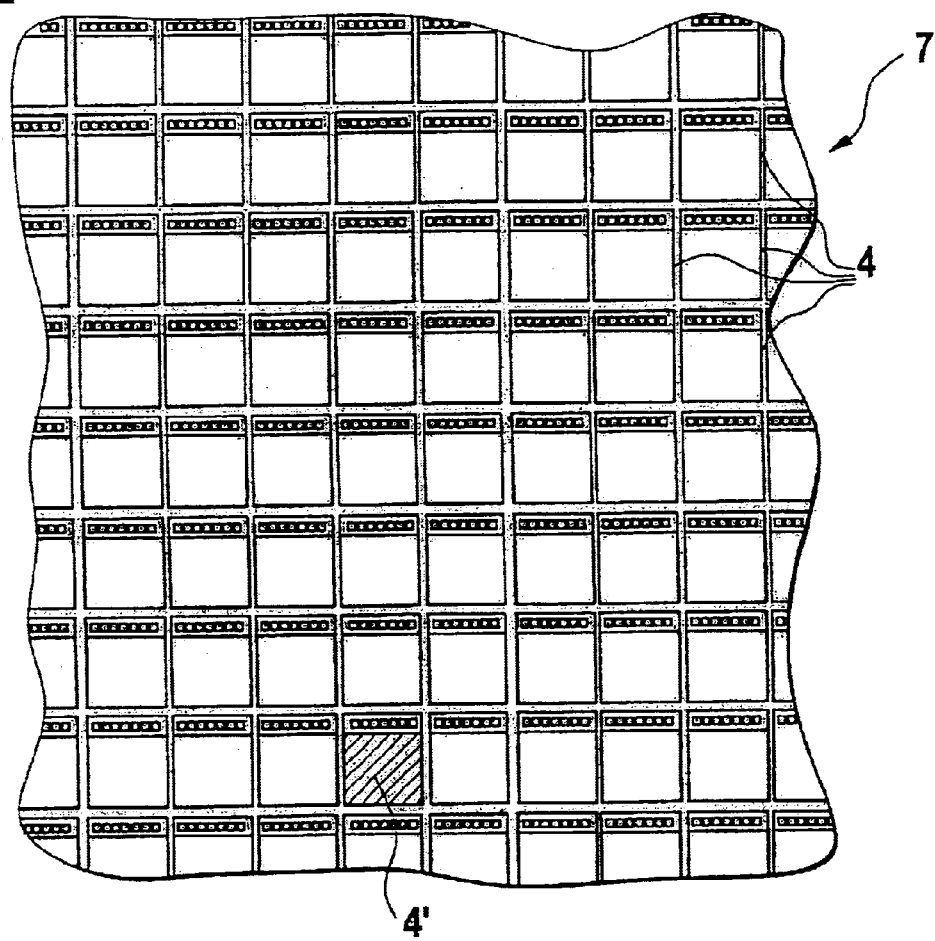
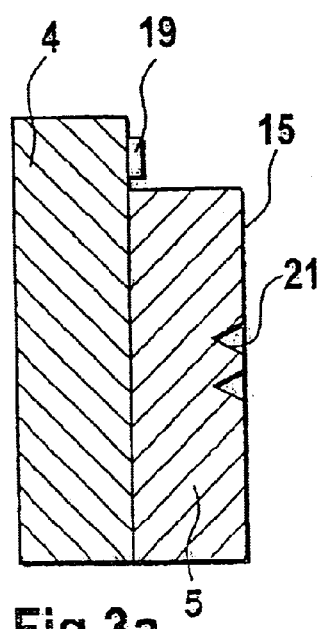
Fig.3a
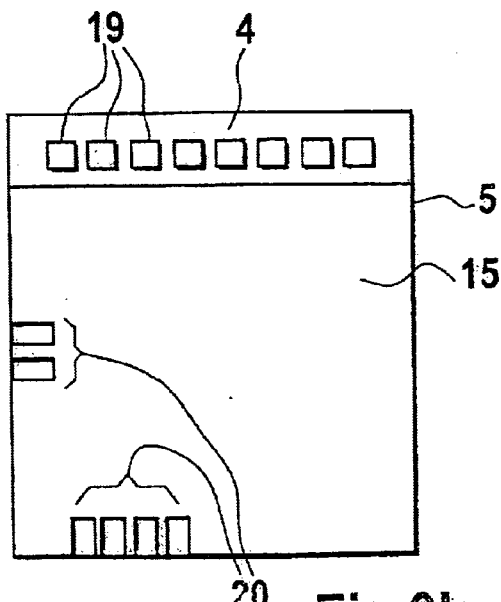
Fig.3b

SEMICONDUCTOR COMPONENT AND A METHOD FOR IDENTIFYING A SEMICONDUCTOR COMPONENT

BACKGROUND OF THE INVENTION

The invention concerns a semiconductor component and a method for identifying a semiconductor component.

It is generally known that semiconductor components can be produced in a panel on a common base substrate such as a silicon wafer. After the semiconductor substrates individually equipped with electronic/electromechanical components are produced, they are diced, which can take place by cutting up the base substrate. The individual semiconductor substrates are then placed on the mounting area of a lead frame and joined with contact sections of the lead frame using bonding wires. In a spraying procedure known as "transfer molding", also referred to as transfer forming, the semiconductor substrate is then embedded—except for its leads formed by the contact portions—in a housing part made of a mold compound. This procedure is described, for example, in "Advanced Microsystems for Automotive Applications 99, D. D. Ricken, W. Gessner, pg. 126ff".

It is often necessary to identify the original position of an individual semiconductor substrate on the base substrate after dicing and production of the finished semiconductor components. This can be necessary, for example, in order to compare preliminary measurement results carried out on the base substrate with final measurement results carried out on the finished, diced semiconductor component. It is therefore desirable to be able to identify the individual semiconductor substrates on the base substrate. Optically detectable identification codes on the semiconductor substrates have the disadvantage that they can no longer be identified after the semiconductor substates are embedded in the housing part. For this reason, the mold compound must first be partially removed, e.g., by etching, so that the identification code of the semiconductor substrate is optically detectable and can be evaluated. The opened and partially destroyed semiconductor element is then no longer usable.

SUMMARY OF THE INVENTION

The semiconductor component according to the invention has the advantage that the semiconductor component can be identified and the original position of the semiconductor substrate—on the base substrate—contained in the semiconductor component can be identified without destroying the semiconductor component. This is achieved by means of an identifier located directly or indirectly on the semiconductor substrate that can be read out using ultrasound from outside the housing part of the semiconductor component. In doing so, full advantage is taken of the fact that the plastic compound of the housing part is permeable to ultrasound, so that an image of the surface structure of the semiconductor element equipped with the identifier can be generated using an ultrasonic device by measuring different trajectories of the irradiated ultrasonic waves or by measuring the ultrasonic waves reflected on the semiconductor component. Said image is then evaluated in order to identify the semiconductor component.

In principle, the identifier can be produced in various ways. It is particularly simple, however, when the identifier is formed by a pattern of recesses in a surface section of the semiconductor substrate or a component located thereon. The recesses can be produced by etching, for example. This is particularly advantageous in the case of semiconductor sensors with which the electronic/electromechanical components on the sensor are formed by etching micromechanical structures and are covered with a cap piece that is also produced by etching. The recesses can then be formed advantageously on an inner side—facing the semiconductor substrate—of the cap piece located on the semiconductor substrate. This is particularly advantageous when the plastic material of the housing part is acoustically well adapted to the material of the semiconductor substrate and the cap piece. In this case, the ultrasonic wave is reflected only slightly on the boundary layer between the housing part and the semiconductor substrate and/or the cap piece. A gas or vacuum is contained in the hollow space formed by the semiconductor substrate and the cap piece, so that an acoustic mismatch always exists on the boundary surface between the inside of the cap piece and the hollow space. The identifier located on the inside of the cap piece is therefore particularly easy to detect using an ultrasonic microscope. Using anisotropic etching, it can be achieved that the interior walls of the recesses are tilted at an angle relative to the surface section in which the recesses are produced, so that the ultrasonic waves are advantageously reflected obliquely to the direction of arrival in the region of the recesses.

In another exemplary embodiment it is provided that the identifier located on the semiconductor substrate or the component is formed by a pattern that is composed of a material layer or a layer system of various materials in which ultrasound propagates at a different speed than in the material of the semiconductor substrate or the component. In this case, advantage is taken of the fact that the application of such a pattern results in an acoustic mismatch of reflectivity, so that an ultrasonic wave is reflected differently on the boundary surface between the pattern material and the semiconductor substrate or component, and/or on the boundary surfaces of two layers of a structured layer system forming the pattern than on the points of the surface of the semiconductor substrate on which the pattern is not provided.

According to another exemplary embodiment, the reflectivity of the ultrasonic wave is changed by changing the adhesive strength of the housing material on the semiconductor substrate. Advantageously, the housing part can be made of a mold compound, and the identifier located on the semiconductor substrate or a component located thereon is formed by means of a pattern composed of a material to which the mold compound adheres more poorly than to the material of the semiconductor substrate or the component. This can be achieved, for example, by forming the identifier out of a pattern of silver spots. By delaminating the mold compound at the points of the surface of the semiconductor substrate equipped with the silver spots, the relectance of the irradiated ultrasonic wave changes, so that the identifier can be read out using an ultrasonic receiver.

It is also possible to form the identifier located on the semiconductor substrate or a component located thereon by means of a pattern composed of a material to which the mold compound adheres better than to the material of the semiconductor component or the component. For example, the identifier on the semiconductor element can be formed by means of a pattern of polyimide spots to which the mold compound of the housing part adheres better than to the semiconductor substrate.

Furthermore advantageous is a method for identifying a semiconductor component that comprises at least one semiconductor substrate equipped with electronic/electromechanical components that, together with a plurality of further semiconductor substrates, is produced on a common base substrate in a panel, whereby the semiconductor substrates, after production, are diced and placed on a lead frame and, finally, except for their respective leads, are enclosed in a housing part, and in which all semiconductor substrates in the panel—before dicing—are equipped with an identifier identifying the position of the respective semiconductor substrate on the base substrate, which said identifier is located directly or indirectly on the semiconductor substrate, and the identification of a selected semiconductor substrate—after dicing and placement in the housing part— is read out using an ultrasonic device from outside the housing part to identify the semiconductor component. An ultrasonic microscope can be used advantageously as the ultrasonic device.

BRIEF DESCRIPTION OF THE DRAWINGS

Exemplary embodiments of the invention are presented in the drawings and are explained in the description hereinbelow.

FIG. 2 shows a top view of a semiconductor element panel, FIGS. 3a and 3b show a cross-section and a top view of a semiconductor substrate equipped with a cap piece before placement in a housing part.

DESCRIPTION OF THE PREFERRED EMBODIMENTS

Figure 1:
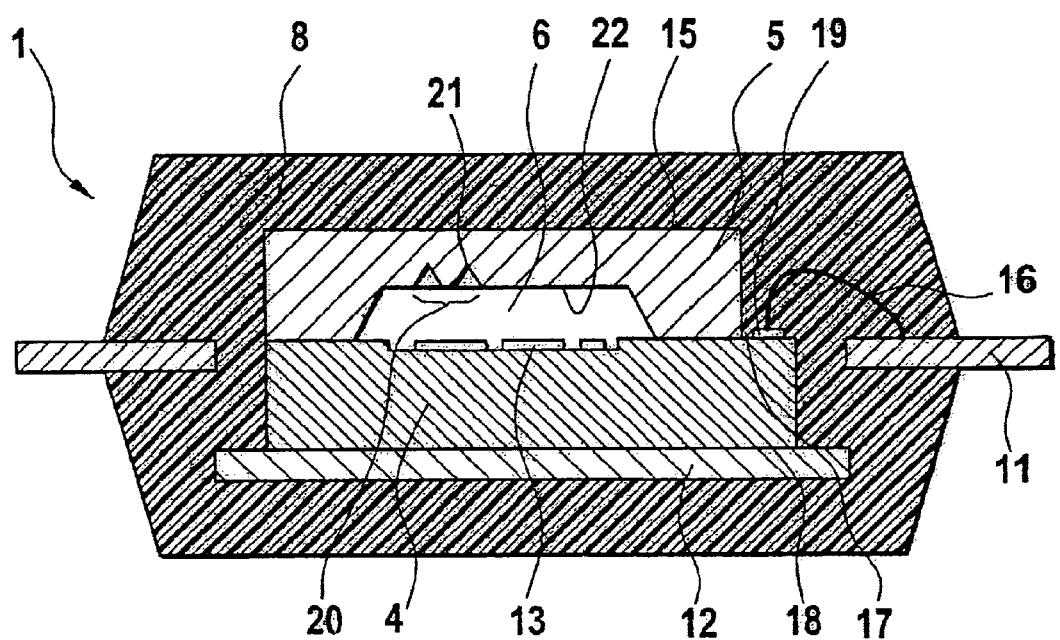
FIG. 1 shows a cross-section through a semiconductor element according to the invention having an ultrasonic identifier located on the inner side of a cap piece.

FIG. 1 shows a cross-section of a semiconductor element according to the invention. The semiconductor element 1 shown can be an acceleration sensor or a motor vehicle, for example, and includes a semiconductor substrate 4, known per se, made of silicon, for example, on the top side 17 of which electromechanical structures 13 are produced in an etching process. The structures 13 on the semiconductor substrate are covered with a cap piece 5 that is also made of a semiconductor material, e.g., silicon, and that is interconnected with the semiconductor substrate by means of a perimeter seal made of glass or in another fashion. The cap piece 5 comprises a recess 6 produced in an etching process that is located above the structures 13. Furthermore, conductor tracks 15 for the electrical contacting of components 13 are located on the top side 17 of the semiconductor substrate 4.

Production of the semiconductor substrate is typically carried out in a panel on a common base substrate that is a silicon wafer, for example. A section of such a base substrate 7 is shown in FIG. 2. The individual semiconductor substrates are produced in a panel on the base substrate, whereby each semiconductor substrate is equipped with electronic and/or electromechanical components 13 and conductor tracks 19. Each of the semiconductor substrates 4 is then covered with a cap piece 5 and diced. Dicing usually takes place by cutting up the wafer. The semiconductor substrates 4 are then placed individually with the bottom side 18 down on a mounting area of a lead frame, and the conductor tracks 19 of the semiconductor substrates 4 are joined with contact sections 11 of the lead frame via bonding wires 16. The contact sections 11 of the lead frame are then separated from each other by means of stamping or cutting, and the semiconductor substrate 4—together with the cap piece 5 in a molding tool—is enclosed—except for the ends of the contact sections 11—in a housing part 8 made of a mold compound. The mold compound can be a thermosetting plastic, for example. The finished semiconductor element 1 is shown in FIG. 1.

In the case of an exemplary embodiment of the semiconductor element according to the invention, it is provided that the inner side 22 of the cap piece 5 is provided with an identifier 20 composed of a pattern of notch-like recesses 21. The recesses 21 can be formed by etching the cap piece and preferably comprise interior walls that are oblique relative to the inner side 22 of the cap piece 5. The identifier 20 contains a code, e.g., a binary code, with which the original position of the semiconductor substrate 4 on the base substrate can be identified. After enclosure in the mold compound, the identifier 20 can no longer be optically detected. Since the semiconductor components 1 do not differ from the outside, it is impossible to optically identify a selected semiconductor component. The identifier 20 can be read out without opening the housing part 8, however, by injecting an ultrasonic wave by means of an ultrasonic device that comprises an ultrasonic transmitter and an ultrasonic receiver. Since the ultrasonic wave penetrates the housing part 8, an image of the surface section 22 having the identifier 20 can be generated and evaluated by measuring differences in the trajectory of the irradiated and received ultrasonic wave or by measuring reflection differences. Since the ultrasonic wave is reflected differently on the recesses 21 than on the surface section 22, the identifier is detected by the ultrasonic device and it can be imaged. An ultrasonic microscope is preferably used for this. By evaluating the identifier, it is possible to determine the original position of the semiconductor substrate 4' embedded in the semiconductor component on the base substrate 7.

The identifier 20 can also be located on the side of the cap piece 5 facing away from the semiconductor substrate 4, as shown in FIG. 3a and FIG. 3b. It is further possible to also locate the identifier 20 directly on the semiconductor substrate 4. Moreover, the identifier 20 does not necessarily have to be formed by means of recesses. It is also possible, for example, to form the identifier located on the semiconductor substrate or a component located thereon by applying a pattern and/or a structured coating. The coating can be composed of a single material layer or a layer system of various materials in which ultrasound propagates at a different speed than in the material of the semiconductor substrate or the component.

According to a further exemplary embodiment, the reflectance of the ultrasonic wave is influenced by changing the adhesive strength of the housing material on the semiconductor substrate. For example, the identifier located on the semiconductor substrate or a component located thereon can be formed by means of a pattern composed of a material to which the mold compound adheres more poorly than to the material of the semiconductor substrate or the component. This can be achieved, for example, by forming the identifier by means of a pattern of silver spots. By delaminating the mold compound at the points on the surface of the semiconductor substrate equipped with silver spots, the reflectance of the irradiated ultrasonic wave changes, so that the identifier can be read out using an ultrasonic receiver. Correspondingly, it is possible to form the identifier located on the semiconductor substrate or a component located thereon by means of a matter composed of a material to which the mold compound adheres better than to the material of the semiconductor component or the component. For example, the identifier can be formed on the semiconductor component using a pattern of polyimide spots to which the mold compound of the housing part adheres better than to the semiconductor substrate.

What is claimed is:

1. A semiconductor component comprising at least one semiconductor substrate (4) equipped with electronic/electromechanical components (13), which said semiconductor substrate—except for its lead (11)—is embedded in a housing part (8) made of plastic, wherein the semiconductor substrate (4) located in the housing part (8) is equipped with an identifier (20) located directly or indirectly on the semiconductor substrate (4) that makes it possible to distinguish the semiconductor component (1) from other similarly-designed semiconductor components, and which can be read out from outside the housing part (8) using ultrasound but that is optically undetectable from outside the housing part (8).

2. The semiconductor component according to claim 1, wherein the identifier (20) is formed by a pattern of recesses (21) in a surface section (15, 22) of the semiconductor substrate (4) or a component (5) located thereon.

3. The semiconductor component according to claim 2, wherein the recesses (21) are produced by etching.

4. The semiconductor component according to claim 2, wherein the interior walls of the recesses (21) are oblique relative to the surface section (15, 22).

5. The semiconductor component according to claim 1, wherein the recesses (21) are formed on an inner side (22)—facing the semiconductor substrate (4)—of a cap piece (5) located on the semiconductor substrate (4), which said cap piece (5), together with the semiconductor substrate (4), forms a hollow space (6).

6. The semiconductor component according to claim 1, wherein the identifier located on the semiconductor substrate or the component is formed by a pattern composed of a material layer or a layer system of various materials in which ultrasound propagates at a different speed than in the material of the semiconductor substrate or the component.

7. The semiconductor component according to claim 1, wherein the housing part is made of a mold compound, and the identifier located on the semiconductor substrate or a component located thereon is formed by a pattern that is composed of a material to which the mold compound adheres more poorly than to the material of the semiconductor substrate or the component.

8. The semiconductor component according to claim 7, wherein the identifier is formed by a pattern of silver spots.

9. The semiconductor component according to claim 1, wherein the housing part is made of a mold compound, and the identifier located on the semiconductor substrate or a component located thereon is formed by a pattern that is composed of a material to which the mold compound adheres better than to the material of the semiconductor substrate or the component.

10. The semiconductor component according to claim 9, wherein the identifier on the semiconductor component is formed by means of a pattern of polyimide spots.

11. A method for identifying a semiconductor component that comprises at least one semiconductor substrate (4) equipped with electronic/electromechanical components (13) that is produced on a panel together with a plurality of further semiconductor substrates (4) on a common base substrate (7), whereby the semiconductor substrates (4), after manufacture, are diced and placed on a lead frame (11, 12) and, finally, are enclosed in a housing part (8)—except for their respective leads (11)—made of plastic, wherein, before dicing, all semiconductor substrates (4) on the panel are equipped with an identifier (20)—directly or indirectly on the semiconductor substrate—identifying the position of the respective semiconductor substrate on the base substrate (7), and the identifier (20) of a selected semiconductor substrate (4'), after dicing and placement in the housing part (8), is read out using an ultrasonic device from outside the housing part (8) to identify the semiconductor element (1).

12. The method according to claim 11, wherein an ultrasonic microscope is used as the ultrasonic device.

* * * * *